US007936182B1

(12) United States Patent
Bourstein

(10) Patent No.: US 7,936,182 B1
(45) Date of Patent: May 3, 2011

(54) ISOLATED LEVEL SHIFTER

(75) Inventor: Ido Bourstein, Pardes Hana (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 0 days.

(21) Appl. No.: 12/773,400

(22) Filed: May 4, 2010

Related U.S. Application Data

(60) Provisional application No. 61/179,582, filed on May 19, 2009.

(51) Int. Cl.
*H03K 19/0175* (2006.01)
(52) U.S. Cl. .................. 326/38; 326/68; 326/81
(58) Field of Classification Search .............. 326/37–41, 326/62–72, 80–83
See application file for complete search history.

(56) References Cited

U.S. PATENT DOCUMENTS 6,087,852 A * 7/2000 Briggs et al. .................... 326/68
7,397,273 B1 * 7/2008 Ng et al. ......................... 326/38

* cited by examiner

*Primary Examiner* — Don P Le

(57) ABSTRACT

An isolated level shifter base cell that is configurable as either an isolated HIGH level shifter or an isolated LOW level shifter based on changes to connection layers, e.g., metal-2 and/or via-1 layers, without adjusting lower layers, or base layers, that form the isolated level shifter base cell. Regardless of the configuration selected, the isolated level shifter base cell requires the same footprint and provides the same input-to-output path timing. Further, the isolated level shifter base cell is configurable as either a HIGH or LOW isolation cell, i.e., without level shifting, based on changes to the connection layers while again maintaining the same footprint and input-to-output path timing. The configuration of the described isolated level shifter base cell can be changed late in the integrated circuit design process without affecting integrated circuit base layers, without changing the integrated circuit footprint, and without introducing integrated circuit timing changes.

20 Claims, 13 Drawing Sheets

| ISOH | | |
|---|---|---|
| INPUT | | OUTPUT |
| A | ISO | Z |
| 0 | 0 | 0 |
| 0 | 1 | 1 |
| 1 | 0 | 1 |
| 1 | 1 | 1 |
| FLOAT | 1 | 1 |

| ISOL ||| |
|---|---|---|---|
| INPUT || OUTPUT | |
| A | ISO | Z | |
| 0 | 0 | 0 | ← 706 |
| 0 | 1 | 0 | ← 708 |
| 1 | 0 | 1 | ← 710 |
| 1 | 1 | 0 | ← 712 |
| FLOAT | 1 | 0 | ← 714 |

ISOLATED LEVEL SHIFTER

INCORPORATION BY REFERENCE

This application claims the benefit of U.S. Provisional Application No. 61/179,582, "Isolated Level Shifter," filed by Ido Bourstein on May 19, 2009, which is incorporated herein by reference in its entirety.

BACKGROUND

An integrated circuit (IC) can use isolation cells and level shifters to couple different circuit modules together. In an example, an IC includes a first circuit module having a power-up mode and a power-down mode, and a second circuit module that powers up at all time during operation. The operation of the second circuit module depends on, for example, a terminal of the first circuit module. The IC can include an isolation cell that couples the first circuit module and the second circuit module together. Thus, when the first circuit module is in the power-down mode, the isolation cell drives a certain logic value to the second circuit module to avoid malfunction due to an undetermined (floating) state on the terminal of the first circuit module.

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

SUMMARY

In accordance with embodiments of the disclosure, an isolated level shifter base cell, or isolated base cell, is described that is configurable as either an isolated HIGH level shifter or an isolated LOW level shifter based on changes only to connection layers, e.g., metal-2 and/or via-1 layers, without adjusting lower layers, or base layers, that form the isolated level shifter base cell. Regardless of the configuration selected, the isolated level shifter base cell requires the same footprint and provides the same input-to-output path timing.

Further, the isolated level shifter base cell is configurable as either an isolated HIGH cell or an isolated LOW cell, i.e., without level shifting, based on changes to connection layers while again maintaining substantially the same footprint and input-to-output path timing.

The advantages of such an isolated level shifter base cell are significant. For example, the configuration of the described isolated level shifter base cell can be changed late in the integrated circuit design process without affecting integrated circuit base layer designs and, therefore, such configuration changes can be made without changing the integrated circuit footprint and without introducing integrated circuit timing changes. Because changes in the base layer integrated circuit design are avoided, the design ripple effects associated with such base level changes, e.g., reconfiguration of the integrated circuit base level layout, corrections to base level components to overcome timing changes introduced by the original base level change, etc., are avoided as well.

In one example embodiment, an integrated circuit is described that includes, a first integrated circuit block, a second integrated circuit block, an isolated base cell that passes data from the first integrated circuit block to the second integrated circuit block, and one or more connection layers that configure the isolated base cell as one of an isolated HIGH cell and an isolated LOW cell.

In a second example embodiment, an isolated base cell is described that includes, a control input stage that receives a control data, an input stage that receives an input data value, an enabled level shifter stage that passes the received input data value from the first integrated circuit block to the second integrated circuit block when the control data value is a first logic value, and a configuration stage that generates and passes a predetermined logic value to the second integrated circuit block when the control data value is a second logic value, in which the predetermined logic value is determined by one or more connection layers that configure the configuration stage to generate one of a HIGH value and a LOW value as the predetermined logic value.

In a third example embodiment, a method of constructing an integrated circuit is described, the method including, constructing integrated circuit base layers for a first integrated circuit block and a second integrated circuit block, constructing integrated circuit base layers for an isolated base cell that, during operation of the integrated circuit, passes data from the first integrated circuit block to the second integrated circuit block, and applying one or more connection layers to the base layers of the isolated base cell to configure the isolated base cell as one of an isolated HIGH cell or an isolated LOW cell.

In example embodiments of the integrated circuit, and example embodiments of the isolated base cell, additional features may be included. For example, the one or more connection layers of the integrated circuit can further configure the isolated base cell as one of an isolated HIGH cell with level shifting and an isolated LOW cell with level shifting. The footprint of the configured isolated base cell included in the integrated circuit can remain the same, regardless of the configuration applied to the isolated base cell. The input-to-output timing of the configured isolated base cell included in the integrated circuit can remain the same, regardless of the configuration applied to the isolated base cell. The one or more connection layers included in the integrated circuit can include one or more of a metal-2 connection layer and a via-1 connection layer. The isolated base cell included in the integrated circuit can include a control input stage that receives a control data, an input stage that receives an input data value, an enabled level shifter stage that passes the received input data value from the first integrated circuit block to the second integrated circuit block when the control data value is a first logic value, and a configuration stage that generates and passes a predetermined logic value to the second integrated circuit block when the control data value is a second logic value. The enabled level shifter stage included in the isolated base cell of the integrated circuit can be a differential logic circuit that produces a logic output based on the received input data value. The predetermined logic value generated by the configuration stage included isolated base cell of the integrated circuit can be determined by the one or more connection layers. The input stage included in the isolated base cell of the integrated circuit can generate one of a level shifted inverted input data value and a non-shifted inverted input data value based on the one or more connection layers.

In other example embodiments of the method constructing an integrated circuit, additional features may be included. For example, the method may further include, the one or more connection layers configuring the isolated base cell as one of an isolated HIGH cell with level shifting and an isolated LOW cell with level shifting, and the one or more connection layers can include one of a metal-2 connection layer and a via-1 connection layer.

BRIEF DESCRIPTION OF THE DRAWINGS

Example embodiments of an isolated level shifter base cell that may be configured as either an isolated HIGH level shifter or an isolated LOW level shifter while retaining the same integrated circuit footprint and retaining the same input-to-output response timing will be described with reference to the following drawings, wherein like numerals designate like elements, and wherein.

DETAILED DESCRIPTION OF EMBODIMENTS

Figure 1:
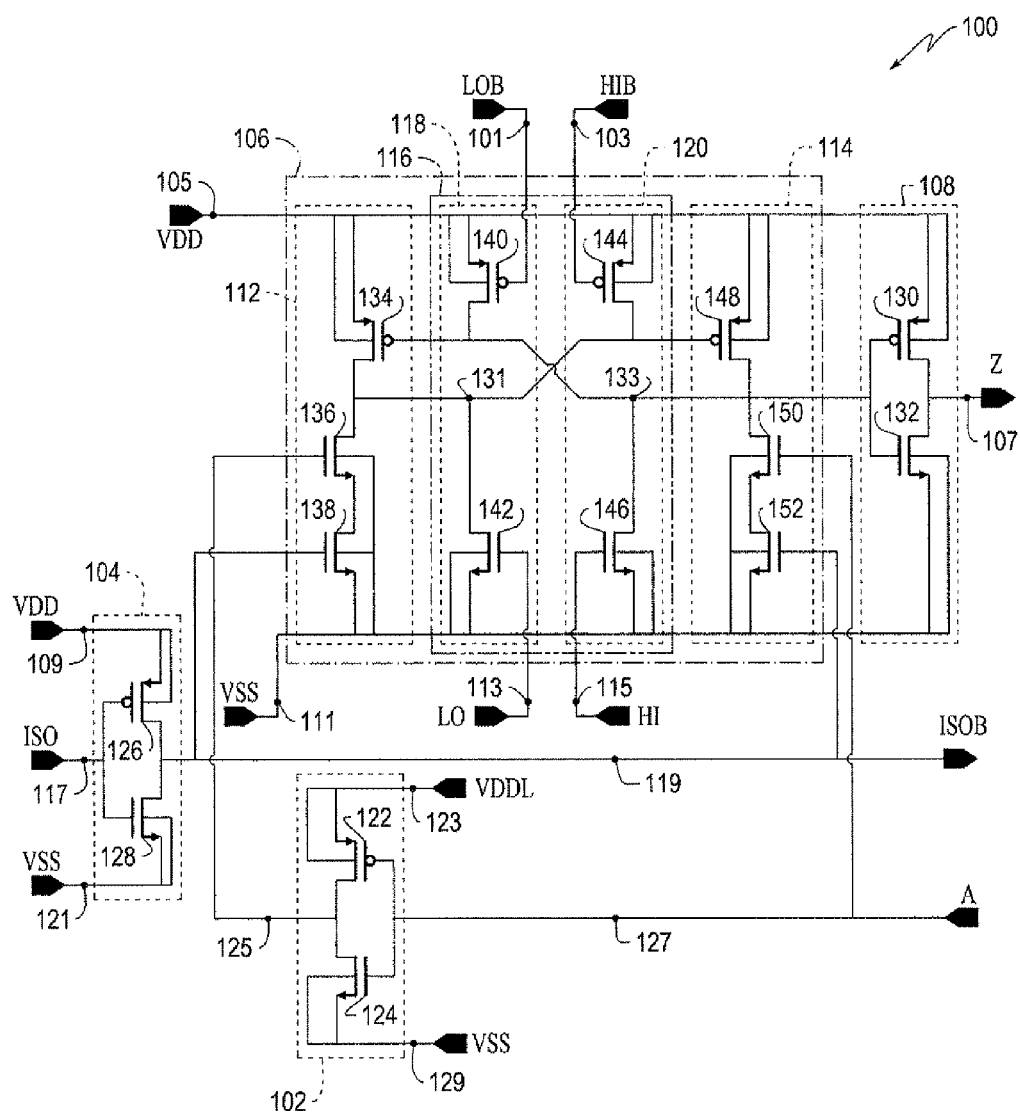
FIG. 1 is a circuit diagram of an example isolated level shifter base cell that may be configured as an isolated HIGH level shifter or an isolated LOW level shifter in accordance with an embodiment of the disclosure.

FIG. 1 is a circuit diagram of an example isolated level shifter base cell that is configurable as either an isolated HIGH level shifter or an isolated LOW level shifter based on changes to upper level connection layers, e.g., metal-2, via-1 layers, etc., and without adjusting lower layers, or base layers, that form the isolated level shifter base cell. An isolated level shifter base cell embodiment of the disclosure, as seen in FIG. 1, may be included in a wide range of integrated circuits to, for example, port logic data from a first logic block to a second logic block, and to provide a predetermined logic value, e.g., HIGH or LOW, to the second logic circuit when the first logic circuit has been disconnected and/or powered down. Further, assuming that the level shifting capabilities associated with the circuit are used, an isolated level shifter base cell embodiment of the disclosure may be used to transfer logic data from a first logic block operating at a first voltage level, to a second logic block operating at a second voltage level, as described below.

In the example embodiment seen in FIG. 1, an isolated level shifter base cell 100, or isolated base cell, includes a data input stage 102, a control input stage 104, an enabled level shifter stage 106, and an output stage 108. As seen in FIG. 1, enabled level shifter stage 106 that includes a left part of the enabled level shifter stage 112 and a right part of the enabled level shifter stage 114, and a configuration stage 116 that includes a left configuration stage 118 and a right configuration stage 120. As further seen in FIG. 1, data input stage 102 includes P-type MOS transistor 122 and N-type MOS transistor 124. Control input stage 104 includes P-type MOS transistor 126 and N-type MOS transistor 128. Left part of the enabled level shifter stage 112 includes P-type MOS transistor 134, N-type MOS transistor 136 and N-type MOS transistor 138. Right part of the enabled level shifter stage 114 includes P-type MOS transistor 148, N-type MOS transistor 150 and N-type MOS transistor 152. Left configuration stage 118 includes P-type MOS transistor 140 and N-type MOS transistor 142. Right configuration stage 120 includes P-type MOS transistor 144 and N-type MOS transistor 146. Output stage 108 includes P-type MOS transistor 130, N-type MOS transistor 132.

In accordance with an embodiment of data input stage 102, the source of P-type MOS transistor 122 is connected to the HIGH voltage source, $V_{DDL}$, at node 123. The drain of P-type MOS transistor 122 is connected to the drain of N-type MOS transistor 124 at node 125, and the source of N-type MOS transistor 124 is connected to the LOW voltage source, $V_{SS}$, at node 129. The gate of P-type MOS transistor 122 and the gate of N-type MOS transistor 124 are connected to node 127 on which binary logic data input, A, is received from an input data source, such as a logic block or other data source. The output of data input stage 102 at node 125 is connected to the gate of N-type MOS transistor 136 of left part of the enabled level shifter stage 112, described below. The input lead of data input stage 102 at node 127 is connected to the gate of N-type MOS transistor 150 of right part of the enabled level shifter stage 114, described below.

In accordance with an embodiment of control input stage 104, the source of P-type MOS transistor 126 is connected to the HIGH voltage source, $V_{DD}$, at node 109. The drain of P-type MOS transistor 126 is connected to the drain of N-type MOS transistor 128 at node 119, and the source of N-type MOS transistor 128 is connected to the LOW voltage source, $V_{SS}$, at node 121. The gate of P-type MOS transistor 126 and the gate of N-type MOS transistor 128 are connected to node 117 on which binary control data input, ISO, is received. The output of control input stage 104 at node 119 is connected to the gate of N-type MOS transistor 138 of left part of the enabled level shifter stage 112 and the gate of N-type MOS transistor 152 of right part of the enabled level shifter stage 114.

In accordance with an embodiment of the left part of the enabled level shifter stage 112, the source of P-type MOS transistor 134 is connected to the HIGH voltage source, $V_{DD}$, at node 105. The drain of P-type MOS transistor 134 is connected to the drain of N-type MOS transistor 136 at node 131, the source of N-type MOS transistor 136 is connected to the drain of N-type MOS transistor 138, and the source of N-type MOS transistor 138 is connected to LOW voltage source, $V_{SS}$, at node 111. The gate of P-type MOS transistor 134 is connected to node 133.

In accordance with an embodiment of the right part of the enabled level shifter stage 114, the source of P-type MOS transistor 148 is connected to the HIGH voltage source, $V_{DD}$, at node 105. The drain of P-type MOS transistor 148 is connected to the drain of N-type MOS transistor 150 at node 133, the source of N-type MOS transistor 150 is connected to the drain of N-type MOS transistor 152, and the source of N-type MOS transistor 152 is connected to LOW voltage source, $V_{SS}$, at node 111. The gate of P-type MOS transistor 148 is connected to node 131.

In accordance with an embodiment of left configuration stage 118 of configuration stage 116, the source of P-type MOS transistor 140 is connected to the HIGH voltage source, $V_{DD}$, at node 105, the drain of P-type MOS transistor 140 is connected to node 133, and the gate of P-type MOS transistor 140 is connected to node 101 on which a first configuration signal, LOB, is received. The drain of N-type MOS transistor 142 is connected to node 131, the source of N-type MOS transistor 142 is connected to $V_{SS}$, at node 111, and the gate of N-type MOS transistor 142 is connected to node 113 on which a second configuration signal, LO, is received.

In accordance with an embodiment of right configuration stage 120 of configuration stage 116, the source of P-type MOS transistor 144 is connected to the HIGH voltage source, $V_{DD}$, at node 105, the drain of P-type MOS transistor 144 is connected to node 131, and the gate of P-type MOS transistor 144 is connected to node 103 on which a third configuration signal, HIB, is received. The drain of N-type MOS transistor 146 is connected to node 133, the source of N-type MOS transistor 146 is connected to $V_{SS}$, at node 111, and the gate of N-type MOS transistor 146 is connected to node 115 on which a fourth configuration signal, HI, is received.

In accordance with an embodiment of output stage 108, the source of P-type MOS transistor 130 is connected to the HIGH voltage source, $V_{DD}$, at node 105. The drain of P-type MOS transistor 130 is connected to the drain of N-type MOS transistor 132 at node 107, and the source of N-type MOS transistor 132 is connected to the LOW voltage source, $V_{SS}$, at node 111. The gate of P-type MOS transistor 130 and the gate of N-type MOS transistor 132 are connected to node 133 on which binary logic data from configurable enabled level shifter stage 106 is received. Output from output stage 108 is provided at node 107, which may be connected to a subsequent logic block, or other data sink.

In operation, data input stage 102 receives a binary logic data input, A, from a logic data source, e.g., an integrated circuit logic block on the same integrated circuit chip, and generates an inverted logic data output, AB, at node 125 based on the received logic data input. The inverted logic data output is provided as logic data input to the gate of N-type MOS transistor 136 of left part of the enabled level shifter stage 112, while the non-inverted input received by data input stage 102 is supplied to the gate of N-type MOS transistor 150 of right part of the enabled level shifter stage 114. It is noted that the HIGH voltage source $V_{DDL}$ of data input stage 102 may be a different, e.g., lower, voltage than the HIGH voltage source $V_{DD}$ supplied to other stages of isolated level shifter base cell 100. Configured in such a manner, enabled level shifter stage 106 acts as a voltage level shifter and serves as an interface between isolated level shifter base cell 100 to a data source circuit operating with a different, e.g., lower, HIGH logic data voltage level.

Control input stage 104 receives a control data input, ISO, from a control data source, e.g., a control block on the same integrated circuit chip, and generates an inverted control data output at node 119 based on the received control data input. The inverted control data output is provided as input data to the gate of N-type MOS transistor 138 of left part of the enabled level shifter stage 112, to the gate of N-type MOS transistor 152 of right part of the enabled level shifter stage 114.

The role of configurable enabled level shifter stage 106 is two-fold. When the value of control data input, ISO, is LOW, the value of inverted control data input, ISOB, is HIGH, N-type MOS transistor 138 and N-type MOS transistor 152 are CLOSED, and the enabled level shifter stage 106 generates at node 133 a logic data value equivalent to AB and level shifted to VDD level. The value at note 133 is inverted by output stage 108 to produce a logic data output, Z, at node 107 that is the binary equivalent of the logic data input, A, received at node 127 and it has an elevated voltage level of VDD. However, when the value of control data input, ISO, is HIGH, the value of inverted control data input, ISOB, is LOW, N-type MOS transistor 138 and N-type MOS transistor 152 are OPEN, and the enabled level shifter stage 106 is disabled, allowing control of the logic data value established at node 133 to be controlled by configuration stage 116, as described below.

Configuration stage 116 is configurable to operate in either a HIGH mode or a LOW mode, as described below. In HIGH mode, the gate of P-type MOS transistor 140 at node 101 is connected to HIGH voltage source $V_{DD}$ and is hence OPEN, the gate of N-type MOS transistor 142 at node 113 is connected to LOW voltage source $V_{DD}$ and is hence OPEN, thereby disabling left configuration stage 118 of configuration stage 116. Further, when configured in HIGH mode, the gate of P-type MOS transistor 144 at node 103 is connected to inverted control data input, ISOB, and the gate of N-type MOS transistor 146 at node 115 is connected to control data input, ISO, so that when ISO is LOW, and ISOB is therefore HIGH, right configuration stage 118 of configuration stage 116 is disabled, but when ISO is HIGH right configuration stage 118 of configuration stage 116 generates a LOW logic data value at node 133 which output stage 108 inverts to generate a HIGH logic data value at node 107.

When configuration stage 116 is configured to operate in LOW mode, the gate of P-type MOS transistor 144 at node 103 is connected to HIGH voltage source $V_{DD}$ and is hence OPEN, the gate of N-type MOS transistor 146 at node 115 is connected to LOW voltage source $V_{DD}$ and is hence OPEN, thereby disabling right configuration stage 120 of configuration stage 116. Further when configured in LOW mode, the gate of P-type MOS transistor 140 at node 101 is connected to inverted control data input, ISOB, and the gate of N-type MOS transistor 142 at node 113 is connected to control data input, ISO, so that when ISO is LOW, and ISOB is therefore HIGH, left configuration stage 118 of configuration stage 116 is disabled, but when ISO is HIGH left configuration stage 118 of configuration stage 116 generates a HIGH logic data value at node 133 which output stage 108 inverts to generate a LOW logic data value at node 107.

As described above with respect to FIG. 1, isolated level shifter base cell 100, is configurable to operate as either an isolated HIGH level shifter, ISOHLS, or an isolated LOW level shifter, ISOLLS, by changing upper level connection layers to configuration stage 116. Such configuration changes using upper level connection layers to configuration stage 116 do not affect the base layers of isolated level shifter base cell 100 and, therefore, the integrated circuit footprint of isolated level shifter base cell 100 configured as an isolated HIGH level shifter and the integrated circuit footprint of isolated level shifter base cell 100 configured as an isolated LOW level shifter is the same. Further, because the transistors of configuration stage 116 are not on the input-to-output path of the isolated level shifter base cell 100 when the value of control data input, ISO, is LOW, i.e., when the value of the logic data value at node 133 is controlled by enabled level shifter stage 106, the input-to-output path timing of isolated level shifter base cell 100 operating in both isolated HIGH and isolated LOW modes is identical.

Further, as described above, and as addressed in further detail below with respect to FIG. 8 and FIG. 9, by configuring isolated level shifter base cell 100 in either isolated HIGH mode or isolated LOW mode such that node 123 of data input stage 102 is connected to HIGH voltage source, $V_{DD}$, instead of to HIGH voltage source, $V_{DDL}$, isolated level shifter base cell 100 is configurable as either an isolated HIGH isolation cell or an isolated LOW isolation cell, without level shifting. Although such a configuration would not provide level shifting, use of isolated level shifter base cell 100 in such a manner has the advantage that the cell can be easily changed from an isolated HIGH isolation cell to an isolated LOW isolation cell, and vice versa, without affecting the footprint of the integrate design, and without affecting the timing of the integrated circuit design, and thereby would reduce the potential impact of such a change on the integrated circuit design, should such a design change be required at some point during the integrated circuit design process.

Figure 2:
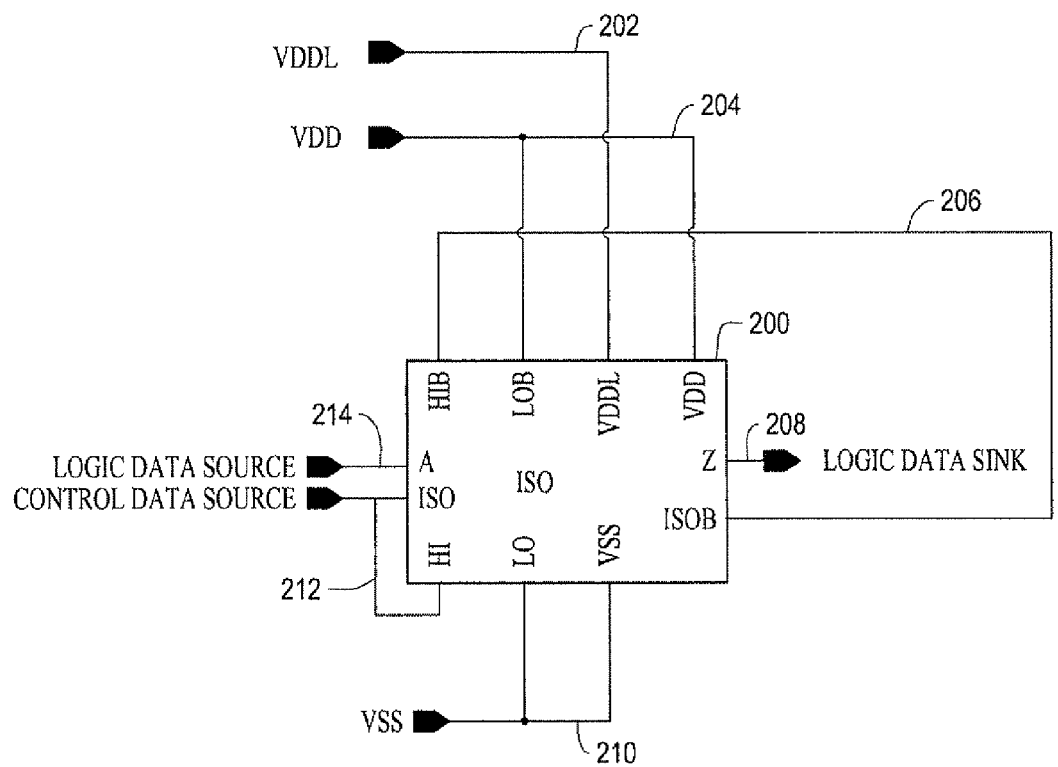
FIG. 2 is a top level diagram of the isolated level shifter base cell of FIG. 1 configured as an isolated HIGH level shifter.

FIG. 2 is a top level diagram of isolated level shifter base cell 100 of FIG. 1 configured as an isolated HIGH level shifter using upper level connection layers, i.e., connection layers that do not affect the base layers of isolated level shifter base cell 100 that are depicted in FIG. 1. For example, as seen in FIG. 2, upper level connection layer 202 connects the $V_{DDL}$ lead of isolated level shifter base cell 100, e.g., as seen in FIG. 1 at node 123, to a HIGH source voltage $V_{DDL}$. Upper level connection layer 204 connects the LOB lead of isolated level shifter base cell 100, e.g., as seen in FIG. 1 at node 101, and the $V_{DD}$ lead of isolated level shifter base cell 100, e.g., as seen in FIG. 1 at node 105 and node 109, to a HIGH source voltage $V_{DD}$. Upper level connection layer 206 connects the ISOB lead of isolated level shifter base cell 100, e.g., as seen in FIG. 1 at node 119, and the HIB lead of isolated level shifter base cell 100, e.g., as seen in FIG. 1 at node 103. Upper level connection layer 208 connects the output lead, Z, of isolated level shifter base cell 100, e.g., as seen in FIG. 1 at node 107 to a logic data sink. Upper level connection layer 210 connects the LO lead of isolated level shifter base cell 100, e.g., as seen in FIG. 1 at node 113, and the $V_{SS}$ lead of isolated level shifter base cell 100, e.g., as seen in FIG. 1 at node 111, node 121, and node 129, to a LOW source voltage $V_{SS}$. Upper level connection layer 212 connects the control input lead, ISO, of isolated level shifter base cell 100, e.g., as seen in FIG. 1 at node 117 and the HI lead of isolated level shifter base cell 100, e.g., as seen in FIG. 1 at node 115 to a control data source. Upper level connection layer 214 connects the input lead, A, of isolated level shifter base cell 100, e.g., as seen in FIG. 1 at node 127 and an input data source such as, for example, a logic block.

Figure 3:
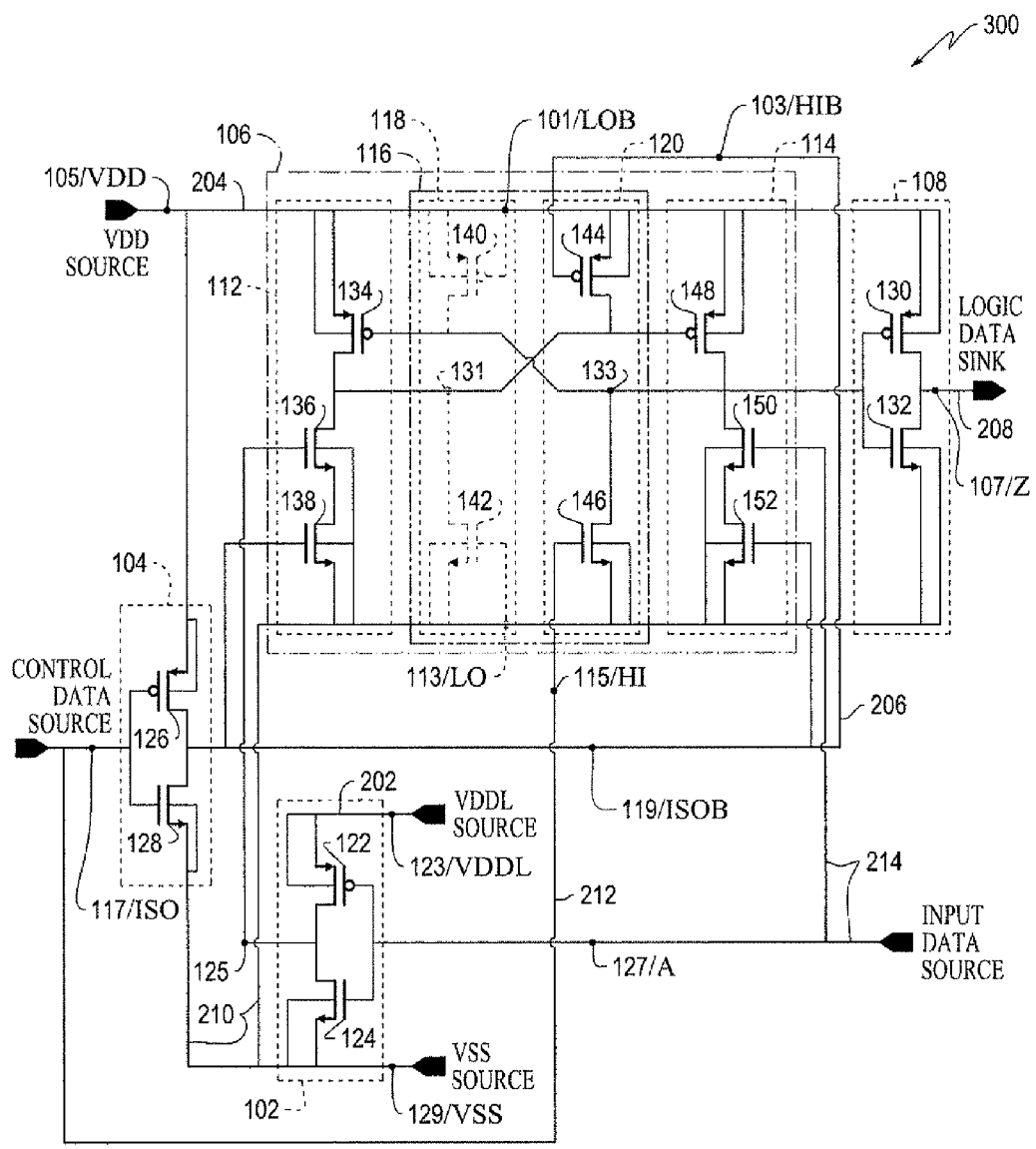
FIG. 3 is a circuit diagram of the isolated level shifter base cell of FIG. 1 configured as an isolated HIGH level shifter.

FIG. 3 is an effective circuit diagram of the isolated level shifter base cell described above with respect to FIG. 1, configured as an isolated HIGH level shifter, as described above with respect to FIG. 2. The isolated level shifter base cell 300 of FIG. 3 is identical to the isolated level shifter base cell 100 described above with respect to FIG. 1. Like features are identically labeled. Therefore, features and operation of isolated level shifter base cell 100 described above with respect to FIG. 1 will not again be described.

The effective circuit diagram of isolated HIGH level shifter 300 presented in FIG. 3 includes upper level connection layers, described above with respect to FIG. 2, that have been layered upon the isolated level shifter base cell to configure the isolated level shifter base cell as isolated HIGH level shifter 300. Further, as described above with respect to FIG. 1 and FIG. 2, when isolated level shifter base cell 100 is configured as an isolated HIGH level shifter 300, P-type NMOS transistor 140 and N-type NMOS transistor 142 are OPEN and, therefore, are effectively removed from the isolated level shifter base cell. For this reason, P-type NMOS transistor 140 and N-type NMOS transistor 142 are shown in the effective circuit diagram of isolated HIGH level shifter 300 seen in FIG. 3 in dotted lines, although N-type NMOS transistor 140 and N-type NMOS transistor 142 remain physically present.

As shown in FIG. 3, high level connection 202 connects the $V_{DDL}$ lead at node 123 to a HIGH source voltage $V_{DDL}$. Upper level connection 204 connects the LOB lead at node 101 and the $V_{DD}$ lead at node 105 to a HIGH source voltage $V_{DD}$. Upper level connection layer 206 connects the HIB lead at node 103 to the ISOB output of control input stage 104 at node 119. Upper level connection layer 208 connects the output lead, Z, at node 107 to a logic data sink. Upper level connection layer 210 connects the LO lead at node 113 to a LOW source voltage $V_{SS}$. Upper level connection layer 212 connects the HI lead at node 115 to a control data source at node 117. Upper level connection layer 214 connects the input lead, A, at node 127 to an input data source.

Figure 4:
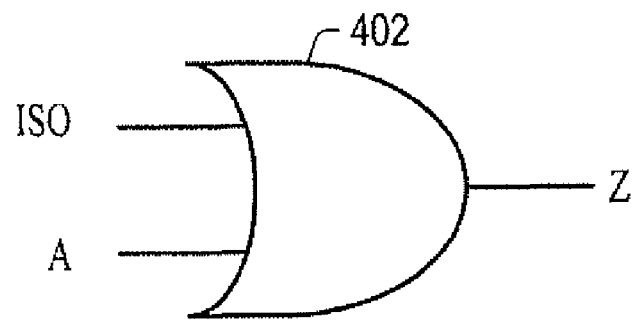
FIG. 4 is a logic table that describes the logic output response generated by the isolated level shifter base cell of FIG. 1, when configured as an isolated HIGH level shifter.

FIG. 4 is a logic table 404 that describes the logic output response generated by the isolated level shifter base cell of FIG. 1, when configured as an isolated HIGH level shifter, as described above with respect to FIG. 2 and FIG. 3. As shown in table 404 at 406 and 410, when the control data value, ISO, at node 117 is LOW, the input data value, A, at node 127 is passed through as the output data value, Z, at node 107. However, as shown in table 404 at 408, 412 and 414, when the control data value, ISO, at node 117 is HIGH, the output data value, Z, at node 107 is fixed HIGH no matter what is the value at input A including a float value which could be caused by a powered down logic module which drives input A. Also seen in FIG. 4, is an example symbol 402 that may be used to represent the isolated level shifter base cell of FIG. 1, when configured as an isolated HIGH level shifter as shown in FIG. 2 and FIG. 3. As indicated by symbol 402, the value of output data value, Z, may be determined by the input data value, A, and the control data value, ISO, based on the relationships seen in logic table 404.

Figure 5:
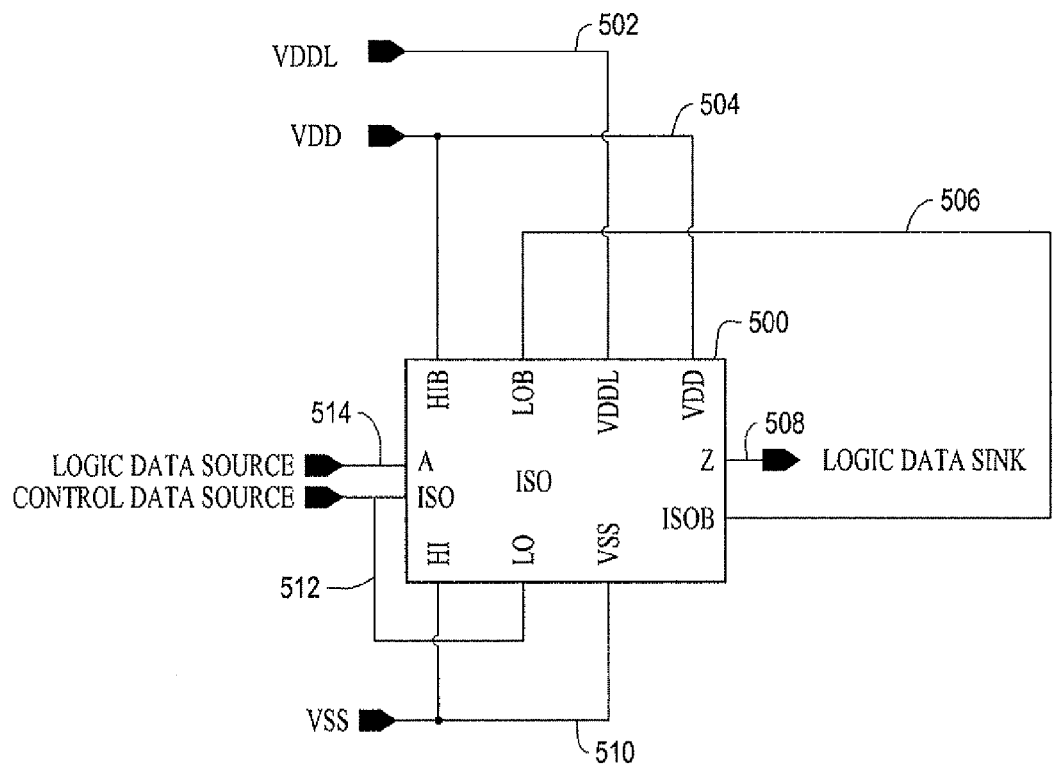
FIG. 5 is a top level diagram of the isolated level shifter base cell of FIG. 1 configured as an isolated LOW level shifter.

FIG. 5 is a top level diagram of isolated level shifter base cell 100 of FIG. 1 configured as an isolated LOW level shifter using upper level connection layers, i.e., connection layers that do not affect the base layers of isolated level shifter base cell 100. For example, as seen in FIG. 5, upper level connection layer 502 connects the $V_{DDL}$ lead of isolated level shifter base cell 100, e.g., as seen in FIG. 1 at node 123, to a HIGH source voltage $V_{DDL}$. Upper level connection layer 504 connects the HIB lead of isolated level shifter base cell 100, e.g., as seen in FIG. 1 at node 103, and the $V_{DD}$ lead of isolated level shifter base cell 100, e.g., as seen in FIG. 1 at node 109 and node 105, to a HIGH source voltage $V_{DD}$. Upper level connection layer 506 connects the ISOB lead of isolated level shifter base cell 100, e.g., as seen in FIG. 1 at node 119, and the LOB lead of isolated level shifter base cell 100, e.g., as seen in FIG. 1 at node 101. Upper level connection layer 508 connects the output lead, Z, of isolated level shifter base cell 100, e.g., as seen in FIG. 1 at node 107 to a logic data sink. Upper level connection layer 510 connects the HI lead of isolated level shifter base cell 100, e.g., as seen in FIG. 1 at node 115, and the $V_{SS}$ lead of isolated level shifter base cell 100, e.g., as seen in FIG. 1 at node 111, node 121, and node 129, to a LOW source voltage $V_{SS}$. Upper level connection layer 512 connects the control input lead, ISO, of isolated level shifter base cell 100, e.g., as seen in FIG. 1 at node 117 and the LO lead of isolated level shifter base cell 100, e.g., as seen in FIG. 1 at node 113 to a control data source. Upper level connection layer 514 connects the input lead, A, of isolated level shifter base cell 100, e.g., as seen in FIG. 1 at node 127 and an input data source such as, for example, a logic block.

Figure 6:
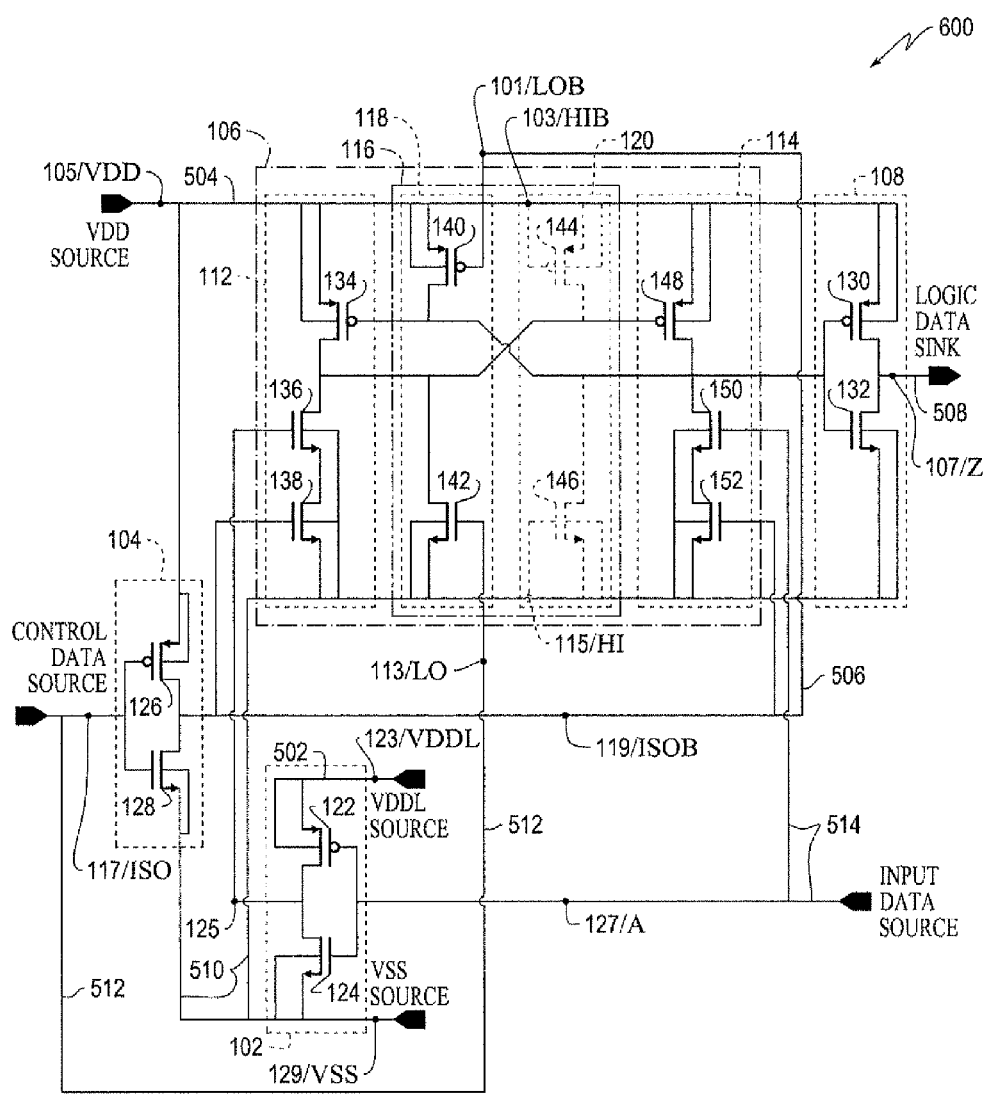
FIG. 6 is a circuit diagram of the isolated level shifter base cell of FIG. 1 configured as an isolated LOW level shifter.

FIG. 6 is an effective circuit diagram of the isolated level shifter base cell described above with respect to FIG. 1, configured as an isolated LOW level shifter, as described above with respect to FIG. 5. The isolated level shifter base cell 600 of FIG. 6 is identical to the isolated level shifter base cell 100 described above with respect to FIG. 1. Like features are identically labeled. Therefore, features and operation of isolated level shifter base cell 100 described above with respect to FIG. 1 will not again be described.

The effective circuit diagram of isolated LOW level shifter 600 presented in FIG. 6 includes upper level connection layers, described above with respect to FIG. 5, that have been layered upon the isolated level shifter base cell to configure the isolated level shifter base cell as isolated LOW level shifter 600. Further, as described above with respect to FIG. 1 and FIG. 5, when isolated level shifter base cell 100 is configured as an isolated LOW level shifter 600, P-type NMOS transistor 144 and N-type NMOS transistor 146 are OPEN and, therefore, are effectively removed from the isolated level shifter base cell. For this reason, P-type NMOS transistor 144 and N-type NMOS transistor 146 are shown in the effective circuit diagram of isolated HIGH level shifter 600 seen in FIG. 6 in dotted lines, although P-type NMOS transistor 144 and N-type NMOS transistor 146 remain physically present.

As seen in FIG. 6, Upper level connection layer 502 connects the $V_{DDL}$ lead at node 123 to a HIGH source voltage $V_{DDL}$. Upper level connection layer 504 connects the HIB lead at node 103 and the $V_{DD}$ lead at node 105 to a HIGH source voltage $V_{DD}$. Upper level connection layer 506 connects the LOB lead at node 101 to the ISOB output of control input stage 104 at node 119. Upper level connection layer 508 connects the output lead, Z, at node 107 to a logic data sink. Upper level connection layer 510 connects the HI lead at node 115 to a LOW source voltage $V_{SS}$. Upper level connection layer 512 connects the LO lead at node 113 to a control data source at node 117. Upper level connection layer 514 connects the input lead, A, at node 127 to an input data source.

Figure 7:
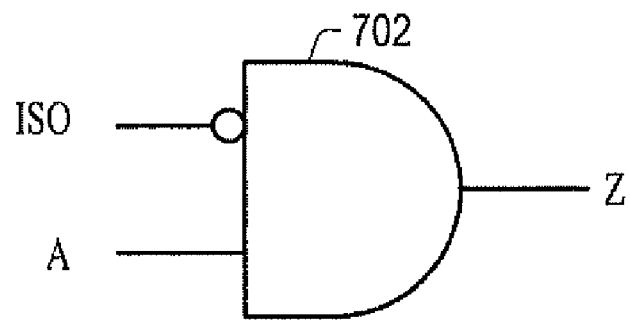
FIG. 7 is a logic table that describes the logic output response generated by the isolated level shifter base cell of FIG. 1, when configured as an isolated LOW level shifter.

FIG. 7 is a logic table 704 that describes the logic output response generated by the isolated level shifter base cell of FIG. 1, when configured as an isolated LOW level shifter, as described above with respect to FIG. 5 and FIG. 6. As shown in table 704 at 706 and 710, when the control data value, ISO, at node 117 is LOW, the input data value, A, at node 127 is passed through as the output data value, Z, at node 107. However, as shown in table 704 at 708, 712 and 714, when the control data value, ISO, at node 117 is HIGH, the output data value, Z, at node 107 is fixed LOW no matter what is the value at input A including a float value which could be caused by a powered down logic module which drives input A. Also shown in FIG. 7, is an example logical symbol 702 that may be used to represent the isolated level shifter base cell of FIG. 1, when configured as an isolated LOW level shifter as shown in FIG. 5 and FIG. 6. As indicated by symbol 702, the value of output data value, Z, may be determined by the input data value, A, and the control data value, ISO, based on the relationships shown in logic table 704.

Figure 8:
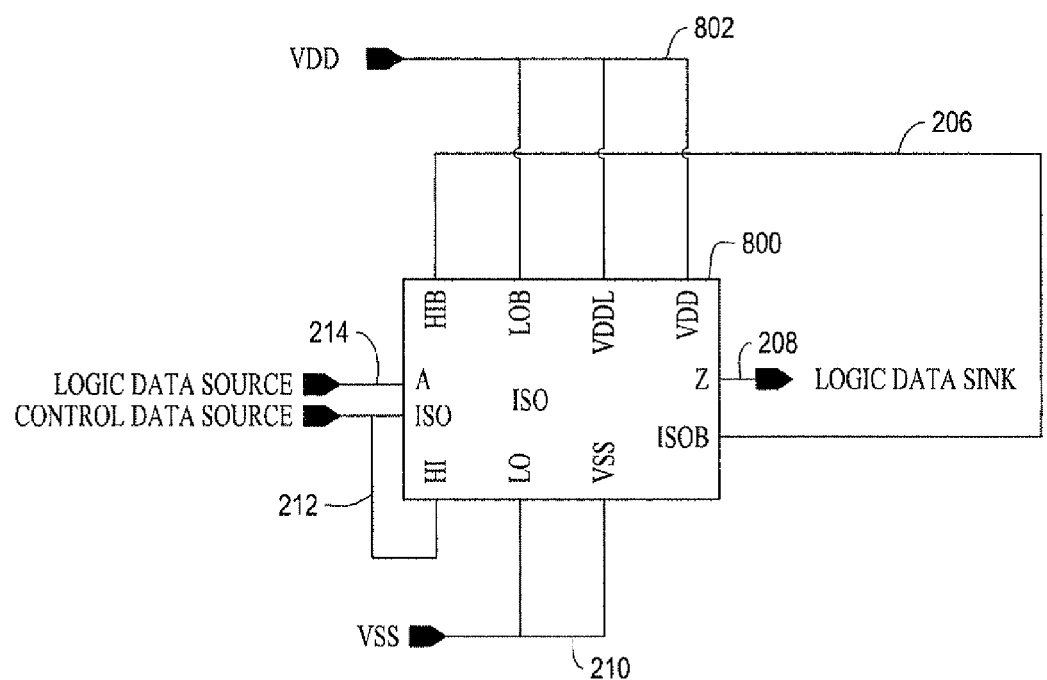
FIG. 8 is a top level diagram of the isolated level shifter base cell of FIG. 1 configured as an isolated HIGH cell without level shifting.

FIG. 8 is a top level diagram of the isolated level shifter base cell of FIG. 2 configured as an isolated HIGH cell without level shifting. FIG. 9 is a top level diagram of the isolated level shifter base cell of FIG. 5 configured as an isolated LOW cell without level shifting. Like features are identically labeled. Therefore, features and operation of the isolated level shifter base cell described above with respect to FIG. 2 and the features and operation of the isolated level shifter base cell described above with respect to FIG. 5 will not again be described.

As seen in FIG. 8, the configuration of an isolated level shifter base cell 800 configured as an isolated HIGH cell without level shifting differs from an isolated level shifter base cell configured as an isolated HIGH cell 200 with level shifting, as described above with respect to FIG. 2, in that the $V_{DDL}$ lead of the isolated level shifter base cell 800 is connected to the HIGH voltage source, $V_{DD}$, and not to a HIGH voltage source, $V_{DDL}$, that has a lower, or different voltage level. For example, as seen in FIG. 8, upper level connection layer 802 connects HIGH voltage source, $V_{DD}$, to both the $V_{DDL}$ lead of the isolated level shifter base cell 800 and to the $V_{DD}$ lead of the isolated level shifter base cell 800. No voltage source, $V_{DDL}$, that has a voltage level that is lower, or different, from HIGH voltage source, $V_{DD}$, is supplied to the circuit.

Figure 9:
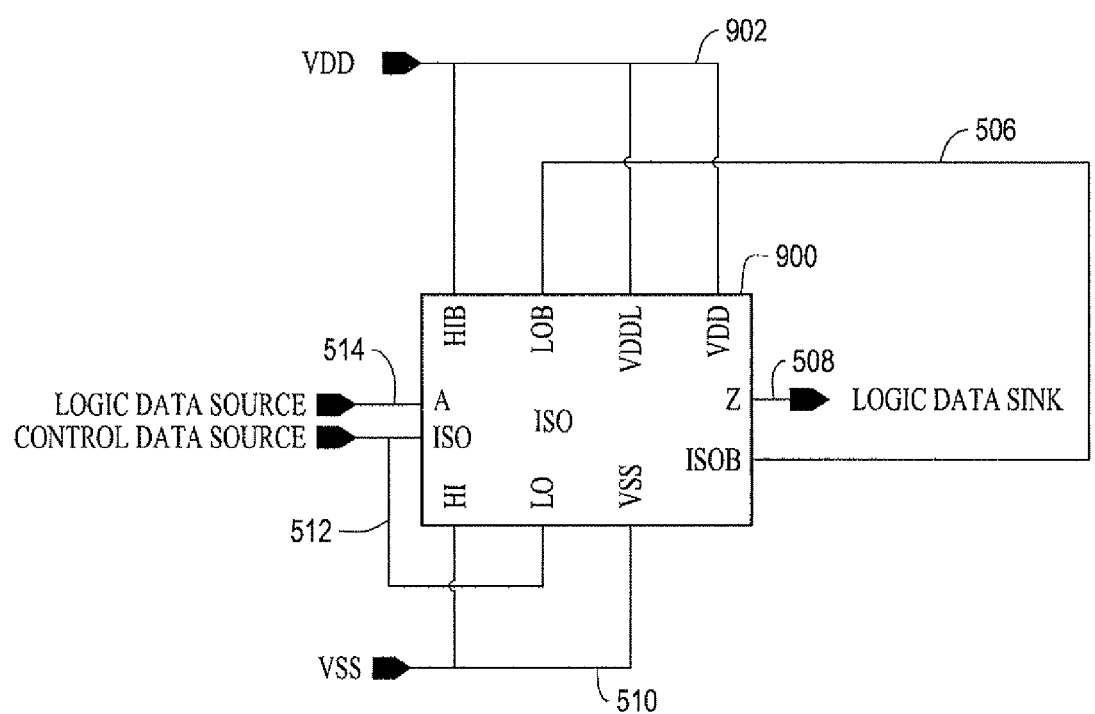
FIG. 9 is a top level diagram of the isolated level shifter base cell of FIG. 1 configured as an isolated LOW cell without level shifting.

As seen in FIG. 9, the configuration of an isolated level shifter base cell 900 configured as an isolated LOW cell without level shifting differs from an isolated level shifter base cell configured as an isolated LOW cell 500 with level shifting, as described above with respect to FIG. 5, in that the $V_{DDL}$ lead of the isolated level shifter base cell 900 is connected to the HIGH voltage source, $V_{DD}$, and not to a HIGH voltage source, $V_{DDL}$, that has a lower, or different voltage level. For example, as seen in FIG. 9, upper level connection layer 902 connects HIGH voltage source, $V_{DD}$, to both the $V_{DDL}$ lead of the isolated level shifter base cell 900 and to the $V_{DD}$ lead of the isolated level shifter base cell 900. No voltage source, $V_{DDL}$, that has a voltage level that is lower, or different, from HIGH voltage source, $V_{DD}$, is supplied to the circuit.

Figure 10:
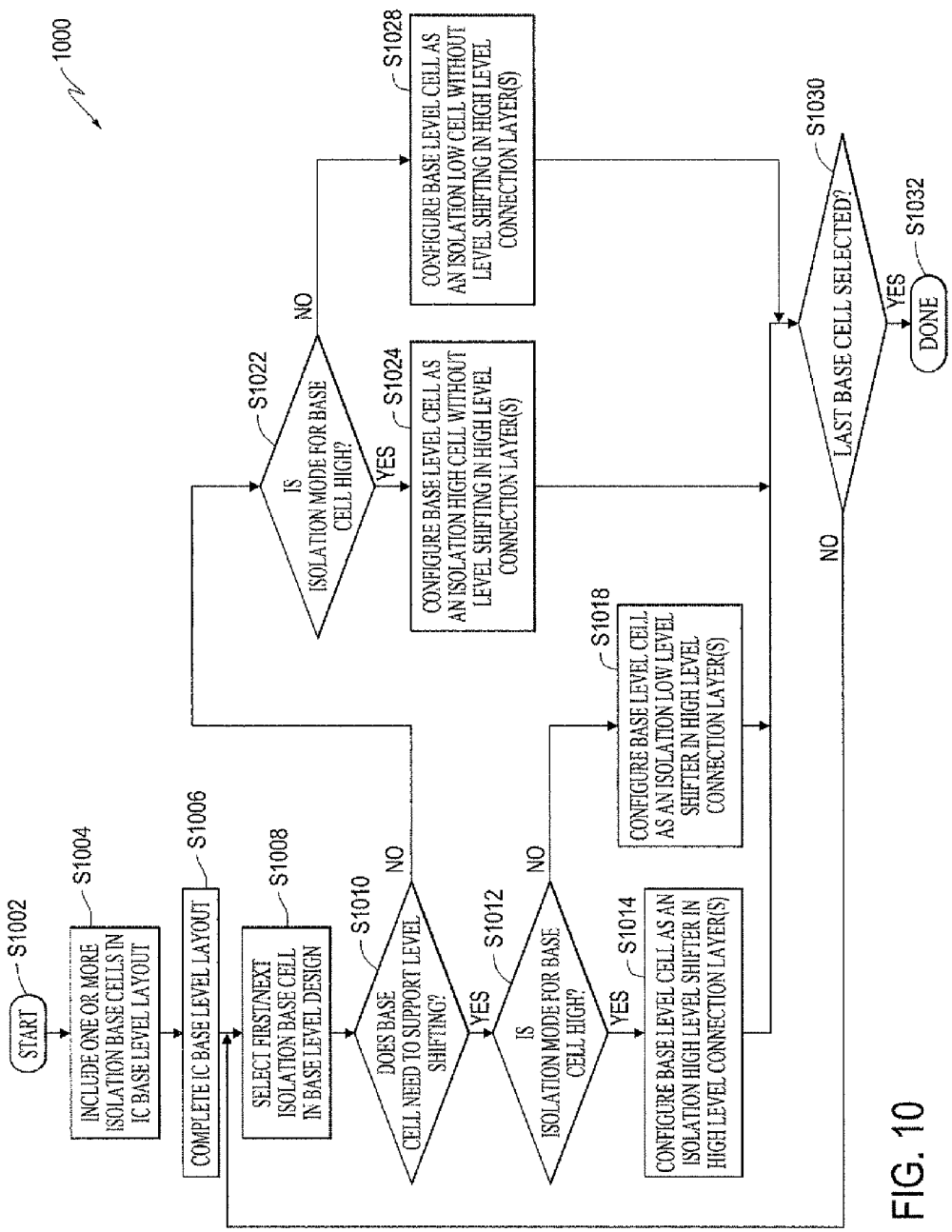
FIG. 10 shows a flow-chart of a process for configuring embodiments of the isolated level shifter base cell of FIG. 1 within an integrated circuit layout design.

FIG. 10 shows a flow-chart of a process for configuring embodiments of the isolated level shifter base cell of FIG. 1 within an integrated circuit layout design. The process described below with respect to FIG. 10 allows an embodiment of isolated level shifter base cell 100 included in the base level layers of the integrated circuit design to be configured as either an isolated HIGH level shifter, an isolated LOW level shifter, an isolated HIGH cell without level shifting, or an isolated LOW cell without level shifting, using upper level connection layers, e.g., a metal-2 layer, via-1 layer, etc., and that do not impact the layout of the underlying base levels. As described above, regardless of the final configuration selected for an embodiment of isolated level shifter base cell 100, the integrated circuit footprint of the underlying base levels and the input-to-output timing of the respective isolation cells remains the same. As shown in FIG. 10, operation of the process begins at step S1002 and proceeds to step S1004.

In step S1004, embodiments of isolated level shifter base cell 100 are included at various locations within an integrated circuit design by including features of isolated level shifter base cell 100 in the respective base layers of the integrated circuit design, and operation of the process continues to step S1006.

In step S1006, the layout of the integrated circuit base level layers is completed and operation of the process continues to step S1008.

In step S1008, a first/next isolated base cell in the base level design is selected, and operation of the process continues to step S1010.

If, in step S1010, the selected isolated base cell is required to support level shifting, operation of the process continues to step S1012, otherwise, operation of the process continues to step S1022.

If, in step S1012, the selected isolated base cell is required to provide a HIGH level output when operating in isolation mode, operation of the process continues to step S1014, otherwise, operation of the process continues to step S1018.

In step S1014, one or more upper level connection layers that will be applied over the base level layers of the selected isolated base cell are configured, as described above with respect to FIG. 2 and FIG. 3, to configure the selected isolated base cell as an isolated HIGH level shifter, and operation of the process continues to step S1030.

In step S1018, one or more upper level connection layers that will be applied over the base level layers of the selected isolated base cell are configured, as described above with respect to FIG. 5 and FIG. 6, to configure the selected isolated base cell as an isolated LOW level shifter, and operation of the process continues to step S1030.

If, in step S1022, the selected isolated base cell is required to provide a HIGH level output when operating in isolation mode, operation of the process continues to step S1024, otherwise, operation of the process continues to step S1028.

In step S1024, one or more upper level connection layers that will be applied over the base level layers of the selected isolated base cell are configured, as described above with respect to FIG. 8 to configure the selected isolated base cell as an isolated HIGH cell without level shifting, and operation of the process continues to step S1030.

In step S1028, one or more upper level connection layers that will be applied over the base level layers of the selected isolated base cell are configured, as described above with respect to FIG. 9, to configure the selected isolated base cell as an isolated LOW cell without level shifting, and operation of the process continues to step S1030.

If, in step S1030, the last isolated base cell has been configured, operation of the process concludes at step S1032, otherwise, operation of the process continues to step S1008.

Figure 11:
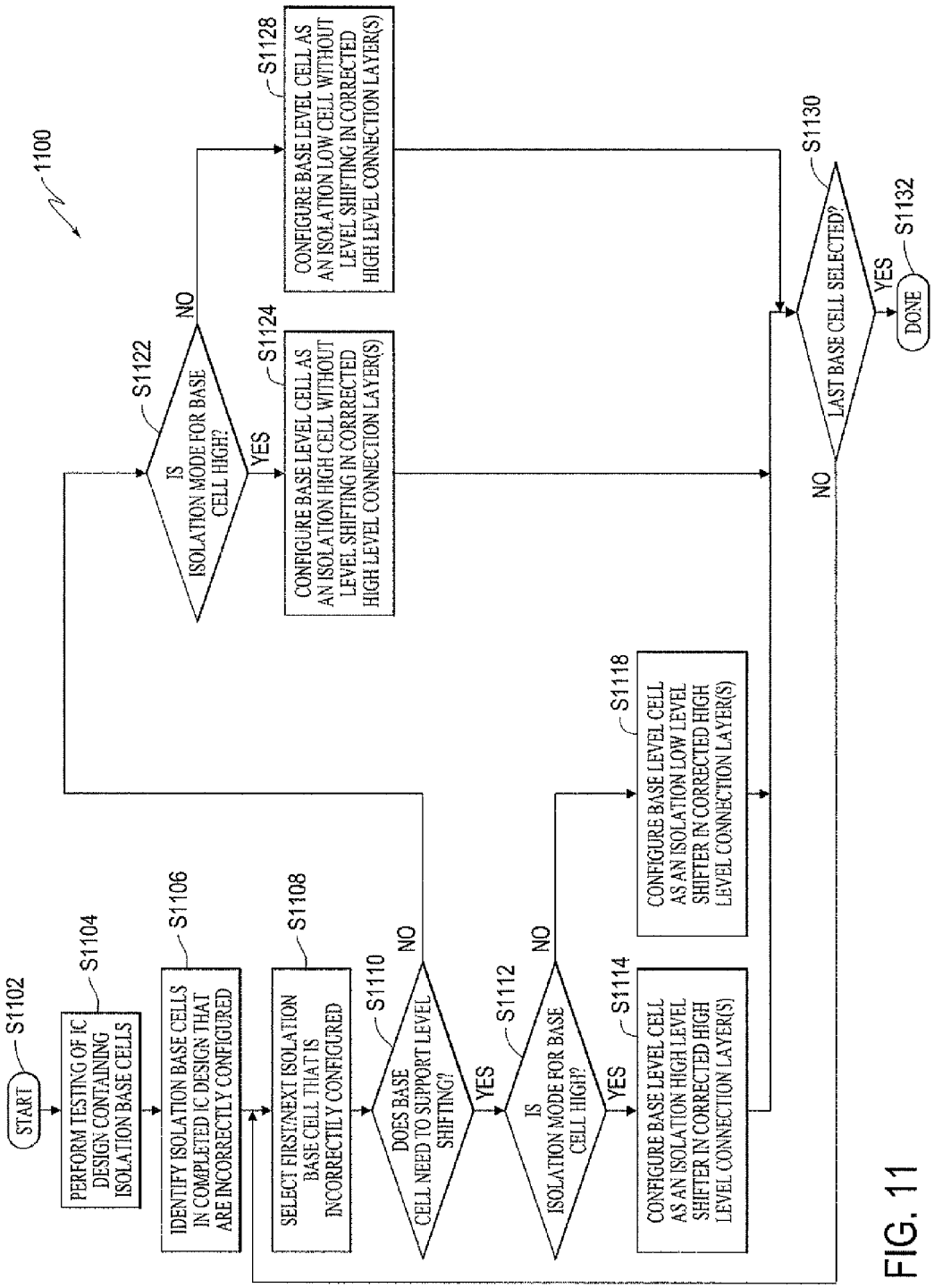
FIG. 11 shows a flow-chart of a process for reconfiguring embodiments of the isolated level shifter base cell of FIG. 1 within an integrated circuit layout design.

FIG. 11 shows a flow-chart of a process for reconfiguring embodiments of the isolated level shifter base cell of FIG. 1 within an integrated circuit layout design. The process described below with respect to FIG. 11 allows the configuration assigned to an embodiment of isolated level shifter base cell 100 included in the base level layers of the integrated circuit design to be changed, should an integrated circuit test process determine that the previously applied configuration was incorrect and the proper configuration for the isolated level shifter base cell has been determined. The process described below with respect to FIG. 11 allows an isolated level shifter base cell of FIG. 1 within an integrated circuit layout design to be reconfigured as either an isolated HIGH level shifter, an isolated LOW level shifter, an isolated HIGH cell without level shifting, or an isolated LOW cell without level shifting, using upper level connection layers, e.g., a metal-2 layer, via-1 layer, etc. The reconfiguration is performed without impacting the layout of the underlying base levels that form the isolated level shifter base cell. As described above, changing the configuration of one or more embodiments of isolated level shifter base cell 100 in an integrated circuit design does not require changes to the base level layers of the integrated circuit that form the integrated circuit. Further, the input-to-output timing of the respective reconfigured isolation cells remains the same as the input-to-output timing of the respective reconfigured isolation cells prior to reconfiguration, so no changes are required elsewhere in the integrated circuit design to accommodate a change in the integrated circuit timing. As shown in FIG. 11, operation of the process begins at step S1102 and proceeds to step S1104.

In step S1104, an integrated circuit design that includes embodiments of isolated level shifter base cell 100 is tested, e.g., using an integrated circuit simulator or other testing process, and operation of the process continues to step S1106.

In step S1106, embodiments of isolated level shifter base cell 100 that are improperly configured are identified, and operation of the process continues to step S1108.

In step S1108, a first/next isolated base cell that is incorrectly configured is selected, and operation of the process continues to step S1110.

If, in step S1110, the selected isolated base cell is required to support level shifting, operation of the process continues to step S1112, otherwise, operation of the process continues to step S1122.

If, in step S1112, the selected isolated base cell is required to provide a HIGH level output when operating in isolation mode, operation of the process continues to step S1114, otherwise, operation of the process continues to step S1118.

In step S1114, the one or more upper level connection layers that will be applied over the base level layers of the selected isolated base cell are corrected/reconfigured to configure the selected isolated base cell as an isolated HIGH level shifter, described above with respect to FIG. 2 and FIG. 3, and operation of the process continues to step S1130.

In step S1118, one or more upper level connection layers that will be applied over the base level layers of the selected isolated base cell are corrected/reconfigured to configure the selected isolated base cell as an isolated LOW level shifter, described above with respect to FIG. 5 and FIG. 6, and operation of the process continues to step S1130.

If, in step S1122, the selected isolated base cell is required to provide a HIGH level output when operating in isolation mode, operation of the process continues to step S1124, otherwise, operation of the process continues to step S1128.

In step S1124, one or more upper level connection layers that will be applied over the base level layers of the selected isolated base cell are corrected/reconfigured to configure the selected isolated base cell as an isolated HIGH cell without level shifting, described above with respect to FIG. 8, and operation of the process continues to step S1130.

In step S1128, one or more upper level connection layers that will be applied over the base level layers of the selected isolated base cell are corrected/reconfigured to configure the selected isolated base cell as an isolated LOW cell without level shifting, described above with respect to FIG. 9, and operation of the process continues to step S1130.

If, in step S1130, the last isolated base cell identified at S1106 has been reconfigured, operation of the process concludes at step S1132, otherwise, operation of the process continues to step S1108.

Figure 12:
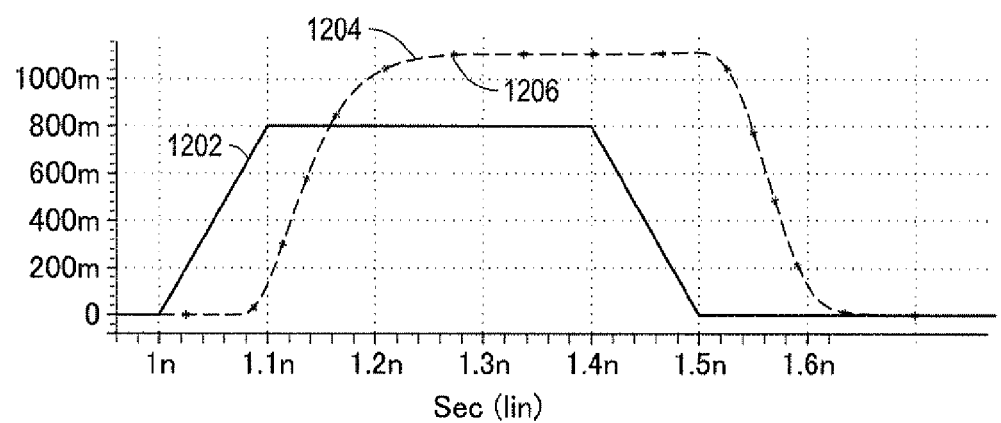
FIG. 12 shows superimposed plots of the input-to-output path response timing of the isolated level shifter base cell of FIG. 1 when configured as an isolated LOW level shifter and when configured as an isolated HIGH level shifter.

FIG. 12 shows simulated output response plots for embodiments of isolated level shifter base cell 100 in response to a sample logic data input signal. Plot 1202 is a plot of a segment of an example logic data input signal that may be provided as input signal to an isolated level shifter base cell 100 configured as either an isolated HIGH level shifter, or an isolated LOW level shifter. Plot 1204 is a simulated output response plot for an embodiment of isolated level shifter base cell 100 configured as an isolated HIGH level shifter, as described above with respect to FIG. 2 to FIG. 4. Plot 1206 is a simulated output response plot for an embodiment of isolated level shifter base cell 100 configured as an isolated LOW level shifter, as described above with respect to FIG. 5 to FIG. 7. Note that plot 1206 is identical to plot 1204. Therefore, plot 1204 and plot 1206 appear to be a single plot. So that the identical shapes of the two plots are distinguishable, plot 1204 is represented in FIG. 12 with dashes, and plot 1206 is represented in FIG. 12 as a broken line with asterisks.

As seen in FIG. 12 with respect to both plot 1204 and plot 1206, regardless of whether the isolated level shifter base cell 100 is configured as an isolated HIGH level shifter or an isolated LOW level shifter, the timing of the output response relative to the received input signal is substantially the same. As described above, isolated level shifter base cell 100 is configured as either an isolated HIGH level shifter or an isolated LOW level shifter with upper level connection layers to control leads of configuration stage 116 that do not affect the base layers of isolated level shifter base cell 100. Further, because the transistors of configuration stage 116 do not affect the input-to-output path of isolated level shifter base cell 100 when the value of control data input, ISO, is LOW, regardless of whether the isolated level shifter base cell 100 is configured as an isolated HIGH level shifter or an isolated LOW level shifter, the timing of isolated level shifter base cell 100 operating in both isolated HIGH and isolated LOW modes is identical. For the same reason, the output response timing of isolated level shifter base cell 100 also remains identical whether isolated level shifter base cell 100 is configured as an isolated HIGH circuit without level shifting, or an isolated LOW circuit without level shifting, as described above.

It is noted that an embodiment of isolated level shifter base cell 100 is configurable, as described above, as either an isolated HIGH level shifter, an isolated LOW level shifter, an isolated, HIGH cell without level shifting or an isolated LOW cell without level shifting, using upper level connection layers that do not affect the base layers of isolated level shifter base cell 100. Regardless of the configuration selected, the footprint of the isolated level shifter base cell 100 is unchanged. In addition, the isolated HIGH level shifter and the isolated LOW level shifter have the same input-to-output timing. Similarly, the isolated HIGH cell without level shifting and the isolated LOW cell without level shifting have the same input-to-output timing (which is different from the input-to-output timing of the isolated HIGH level shifter or the isolated LOW level shifter, e.g., due to the voltage difference). Therefore, should a change to the configuration of an embodiment of isolated level shifter base cell 100 be required during the integrated circuit design and/or test phases, such changes can be implemented without affecting the layout of integrated circuit base levels and without affecting the timing of the integrated circuit. This allows such changes to be implemented in less time and at less cost than otherwise would be required.

It is noted that the circuit level diagrams described above are examples only and should not be interpreted as limiting the described isolated level shifter base cell to any specific integrated circuit technology.

For purposes of explanation in the above description, numerous specific details are set forth in order to provide a thorough understanding of the described isolated level shifter base cell that may be configured as either an isolated HIGH level shifter, an isolated LOW level shifter, an isolated HIGH cell without level shifting or an isolated LOW cell without level shifting, while retaining the same integrated circuit footprint and retaining the same output response timing. It is noted, however, that the described embodiments may be practiced without these specific details. In other instances, various structures and devices are omitted from the figures, or are depicted in simplified block diagram form, in order to avoid obscuring the teaching features of the described embodiments.

Figure 13:
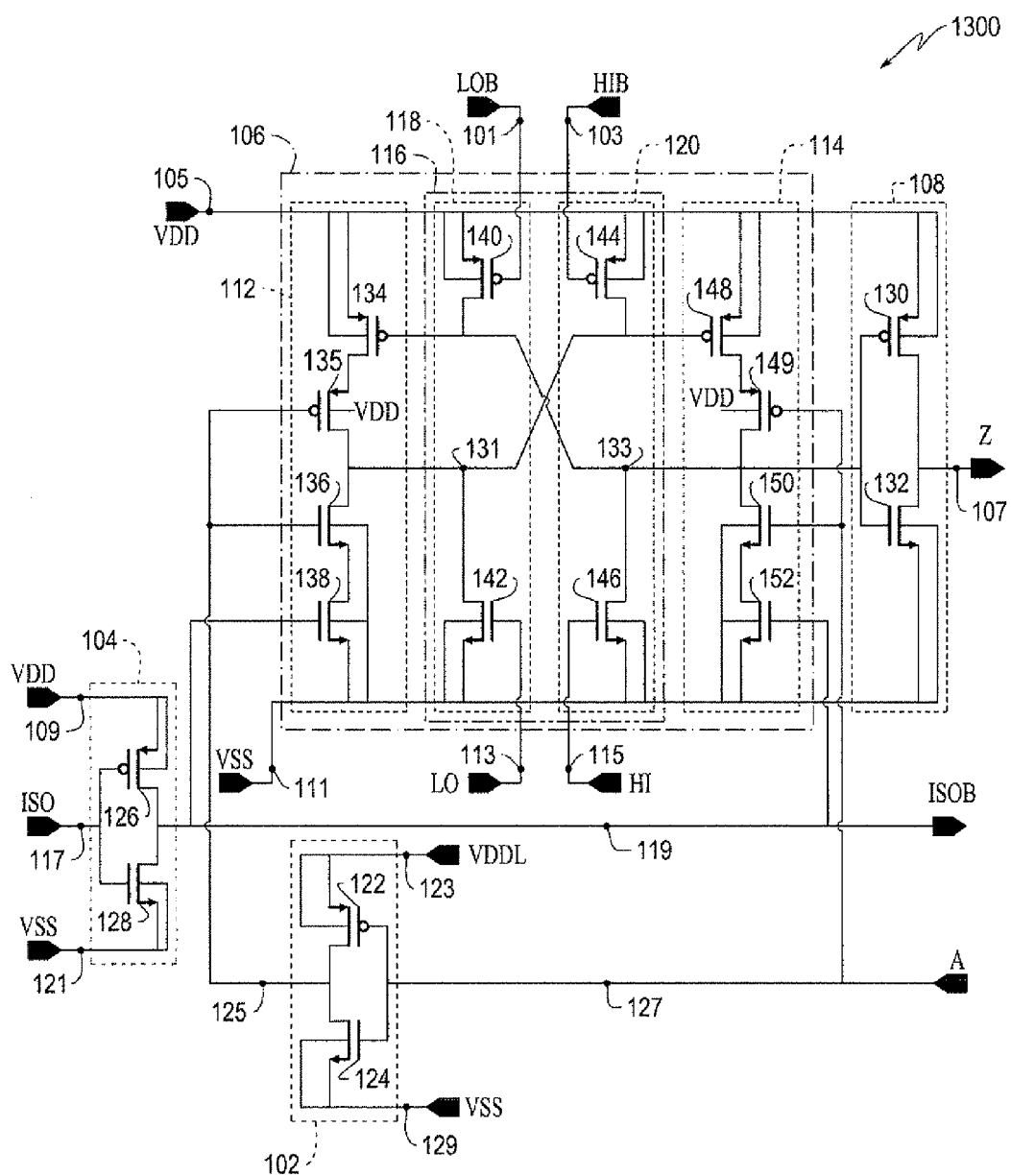
FIG. 13 is a circuit diagram of another example isolated level shifter base cell that may be configured as an isolated HIGH level shifter or an isolated LOW level shifter in accordance with an embodiment of the disclosure.

FIG. 13 is a circuit diagram of another example isolated level shifter base cell 1300 that may be configured as an isolated HIGH level shifter or an isolated LOW level shifter in accordance with an embodiment of the disclosure. Comparing to the isolated level shifter base cell 100, the isolated level shifter base cell 1300 includes two additional P-type MOS transistors 135 and 149. The two additional P-type MOS transistors 135 and 149 are respectively inserted in the differentially coupled left part of the enabled level shifter stage 112 and the right part of the enabled level shifter stage 114. Specifically, P-type MOS transistor 135 is coupled with N-type MOS transistor 136 in a complementary manner to receive the inverted logic data output from data input stage 102. P-type MOS transistor 149 is coupled with N-type MOS transistor 150 in a complementary manner to receive the non-inverted logic data input. The isolated level shifter base cell 1300 improves a rise/fall timing balance, such that a rising time of Z in response to A rising is substantially equivalent to a falling time of Z in response to A falling.

It is noted that the isolated level shifter base cell 1300 can be configured as an isolated HIGH level shifter, an isolated LOW level shifter, an isolated HIGH cell, an isolated LOW cell in the same manner as the isolated level shifter base cell 100, as shown by FIGS. 2, 5, 8 and 9.

While the isolated level shifter base cell that may be configured as either an isolated HIGH level shifter, an isolated LOW level shifter, an isolated HIGH cell without level shifting or an isolated LOW cell without level shifting, while retaining the same integrated circuit footprint and retaining the same output response timing has been described in conjunction with the specific embodiments thereof, it is evident that many alternatives, modifications, and variations will be apparent to those skilled in the art. Accordingly, the described embodiments, as set forth herein, are intended to be illustrative, not limiting. There are changes that may be made without departing from the spirit and scope of the invention.

What is claimed is:

1. An integrated circuit, comprising:
   a first integrated circuit block;
   a second integrated circuit block;
   an isolated base cell that passes data from the first integrated circuit block to the second integrated circuit block; and
   one or more connection layers that configure the isolated base cell as one of an isolated HIGH cell and an isolated LOW cell.

2. The integrated circuit of claim 1, wherein the one or more connection layers further configure the isolated base cell as one of an isolated HIGH cell with level shifting and an isolated LOW cell with level shifting.

3. The integrated circuit of claim 2, wherein a footprint of the configured isolated base cell remains the same, regardless of the configuration applied to the isolated base cell.

4. The integrated circuit of claim 2, wherein an input-to-output timing of the configured isolated base cell remains the same, regardless of the configuration applied to the isolated base cell.

5. The integrated circuit of claim 1, wherein a footprint of the configured isolated base cell remains the same, regardless of the configuration applied to the isolated base cell.

6. The integrated circuit of claim 1, wherein an input-to-output timing of the configured isolated base cell remains the same, regardless of the configuration applied to the isolated base cell.

7. The integrated circuit of claim 1, wherein the one or more connection layers include one of a metal-2 connection layer and a via-1 connection layer.

8. The integrated circuit of claim 1, the isolated base cell comprising:
- a control input stage that receives a control data;
- an input stage that receives an input data value;
- an enabled level shifter stage that passes the received input data value from the first integrated circuit block to the second integrated circuit block when the control data value is a first logic value; and
- a configuration stage that generates and passes a predetermined logic value to the second integrated circuit block when the control data value is a second logic value.

9. The integrated circuit of claim 8, wherein the enabled level shifter stage is a differential logic circuit that produces a logic output based on the received input data value.

10. The integrated circuit of claim 8, wherein the predetermined logic value generated by the configuration stage is determined by the one or more connection layers.

11. An isolated base cell comprising:
- a control input stage that receives a control data;
- an input stage that receives an input data value;
- an enabled level shifter stage that passes the received input data value from the first integrated circuit block to the second integrated circuit block when the control data value is a first logic value; and
- a configuration stage that generates and passes a predetermined logic value to the second integrated circuit block when the control data value is a second logic value;
- wherein the predetermined logic value is determined by one or more connection layers that configure the configuration stage to generate one of a HIGH value and a LOW value as the predetermined logic value.

12. The isolated base cell of claim 11, wherein the enabled level shifter stage is a differential logic circuit that produces a logic output based on the received input data value.

13. The isolated base cell of claim 11, wherein a footprint of the configured isolated base cell remains the same, regardless of the configuration applied to the configuration stage.

14. The isolated base cell of claim 11, wherein an input-to-output timing of the configured isolated base cell remains the same, regardless of the configuration applied to the configuration stage.

15. The isolated base cell of claim 11, wherein an input-to-output timing of the configured isolated base cell remains the same, regardless of whether the input stage is configured to perform level shifting.

16. A method of constructing an integrated circuit, comprising:
- constructing integrated circuit base layers for a first integrated circuit block and a second integrated circuit block;
- constructing integrated circuit base layers for an isolated base cell that, during operation of the integrated circuit, passes data from the first integrated circuit block to the second integrated circuit block;
- applying one or more connection layers to the base layers of the isolated base cell to configure the isolated base cell as one of an isolated HIGH cell or an isolated LOW cell.

17. The method of claim 16, wherein the one or more connection layers further configure the isolated base cell as one of an isolated HIGH cell with level shifting and an isolated LOW cell with level shifting.

18. The method of claim 16, wherein the one or more connection layers include one of a metal-2 connection layer and a via-1 connection layer.

19. The method of claim 18, further comprising:
- determining a first configuration of the isolated base cell; and
- applying the one or more connection layers to the base layers of the isolated base cell according to the determined configuration.

20. The method of claim 19, further comprising:
- re-determining a second configuration of the isolated base cell when the first configuration is detected to be incorrect; and
- re-applying the connection layers to the base layers of the isolated base cell according to the re-determined configuration without changing the base layers.

* * * * *